United States Patent
Yuan

(10) Patent No.: US 7,756,221 B2
(45) Date of Patent: *Jul. 13, 2010

(54) SYSTEM AND METHOD FOR DC OFFSET COMPENSATION AND BIT SYNCHRONIZATION

(75) Inventor: Rebecca W. Yuan, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 140 days.

This patent is subject to a terminal disclaimer.

(21) Appl. No.: 12/181,837

(22) Filed: Jul. 29, 2008

(65) Prior Publication Data

US 2009/0003491 A1    Jan. 1, 2009

Related U.S. Application Data

(63) Continuation of application No. 11/759,001, filed on Jun. 6, 2007, now Pat. No. 7,409,014, which is a continuation of application No. 10/035,567, filed on Oct. 22, 2001, now Pat. No. 7,231,000.

(51) Int. Cl.
 *H04L 25/10* (2006.01)
(52) U.S. Cl. ..................................... 375/319
(58) Field of Classification Search ................. 375/285, 375/317, 319, 326; 455/75, 334, 283, 296
See application file for complete search history.

(56) References Cited

U.S. PATENT DOCUMENTS

| | | | |
|---|---|---|---|
| 5,566,214 A | 10/1996 | Kroeger et al. | |
| 5,568,520 A | 10/1996 | Lindquist et al. | |
| 5,629,960 A | 5/1997 | Dutkiewicz et al. | |
| 5,640,416 A | 6/1997 | Chalmers | |
| 5,644,600 A | 7/1997 | Kawai | |
| 5,654,991 A | 8/1997 | Andren et al. | |
| 5,724,384 A | 3/1998 | Kim et al. | |
| 5,768,323 A | 6/1998 | Kroeger et al. | |
| 5,818,544 A | 10/1998 | Han | |
| 5,844,935 A | 12/1998 | Shoji | |
| 5,867,525 A | 2/1999 | Giallorenzi et al. | |
| 6,141,372 A | 10/2000 | Chalmers | |
| 6,229,839 B1 | 5/2001 | Levin et al. | |
| 6,236,648 B1 | 5/2001 | Umetsu | |
| 6,370,205 B1 | 4/2002 | Lindoff et al. | |
| 6,643,336 B1 | 11/2003 | Hsieh et al. | |
| 6,654,593 B1 | 11/2003 | Simmons et al. | |
| 6,697,098 B1 | 2/2004 | Wang | |
| 6,714,774 B1 | 3/2004 | Nafie et al. | |
| 6,760,705 B2 | 7/2004 | Dvorak | |
| 6,873,666 B2 | 3/2005 | Chen | |
| 7,136,447 B2 | 11/2006 | Chen et al. | |

(Continued)

OTHER PUBLICATIONS

Specification of the Bluetooth System, Wireless Connections Made Easy v. 1.0B Dec. 1, 1999, pp. 1-1080 Specification vol. 1.

*Primary Examiner*—Khanh C Tran
(74) *Attorney, Agent, or Firm*—McAndrews, Held & Malloy, Ltd.

(57) ABSTRACT

A system and method for compensating for DC offset and/or clock drift on a wireless-enabled device is described. One embodiment includes a radio module, an A/D converter connected to the radio module, a DC tracking loop connected to the A/D converter, and a multi-hypothesis bit synchronizer.

20 Claims, 8 Drawing Sheets

U.S. PATENT DOCUMENTS

| | | |
|---|---|---|
| 7,158,598 B2 | 1/2007 | Schetelig et al. |
| 7,231,000 B2 * | 6/2007 | Yuan .......................... 375/319 |
| 7,302,022 B2 * | 11/2007 | Kim et al. .................... 375/345 |
| 7,409,014 B2 * | 8/2008 | Yuan .......................... 375/319 |
| 2003/0076905 A1 | 4/2003 | Schetelig et al. |

* cited by examiner

SYSTEM AND METHOD FOR DC OFFSET COMPENSATION AND BIT SYNCHRONIZATION

CROSS-REFERENCE TO RELATED APPLICATIONS

The present application is a CONTINUATION of U.S. application Ser. No. 11/759,001, filed Jun. 6, 2007, which is a CONTINUATION of U.S. application Ser. No. 10/035,567, filed Oct. 22, 2001, now issued U.S. Pat. No. 7,231,000.

The above-identified applications are hereby incorporated herein by reference in their entirety.

RELATED APPLICATIONS

The present application is related to the following commonly owned and assigned U.S. applications: U.S. application Ser. No. 10/027,558, now U.S. Pat. No. 7,035,350, filed Oct. 22, 2001; U.S. application Ser. No. 11/411,469, now U.S. Pat. No. 7,221,717, filed Apr. 25, 2006; and U.S. application Ser. No. 11/752,184, now U.S. Pat. No. 7,526,016, filed May 22, 2007. The above-identified applications are hereby incorporated by reference herein in their entirety.

FIELD OF THE INVENTION

The present invention relates to wireless communication devices and protocols. In particular, but not by way of limitation, the present invention relates to systems and methods for improving the quality and commercial appeal of wireless communications and wireless communication devices.

BACKGROUND OF THE INVENTION

Wireless communications and wireless communication devices are at the center of many important technological advancements. As the proliferation of these wireless devices increases, the efficiency and accuracy of the communications therebetween becomes vital to the commercial success of particular devices and particular communication protocols. One protocol that is showing great promise is Bluetooth, (*The Specification of the Bluetooth System*, v1.0 B, Dec. 1, 1999 is incorporated herein by reference) which is a wireless protocol that describes how mobile phones, computers, PDAs, peripherals and other devices can interconnect using short-range wireless connections.

To implement Bluetooth and other such wireless protocols, a device receiving a transmitted signal is required to recover bit patterns carried by the transmitted signal. This recovery process involves waveform demodulation, DC compensation, bit synchronization and bit detection. Waveform demodulation usually is implemented in a radio module and is wireless protocol dependent.

DC compensation typically involves correcting for a DC offset arising during the signal recovery process. This DC offset comprises a variation in the intended DC voltage of the recovered baseline signal caused, for example, by frequency drift in the received Bluetooth signal. Present devices compensate for DC-related imperfections in incoming signals using a variety of means, none of which are completely satisfactory. For example, certain electronic devices use analog components to calculate and track DC offset, while others use digital components. In this regard analog "DC trackers" usually are implemented as lowpass RC filters, while conventional digital approaches generally require a select number of bits to be buffered before any DC offset can be calculated.

The accuracy of the DC tracking performed by both conventional analog and digital circuits is affected by characteristics of the incoming bit patterns. For instance, when a string of high values, e.g., "1s," is received, the computed DC offset will be adjusted to a higher value even though the actual DC offset has not changed. This is because most approaches to DC tracking automatically assume an even distribution of high and low values in the received signal. In addition, in analog approaches the accuracy of DC tracking and of the associated estimated variance are sensitive to the selected time constants of the analog filters employed. In conventional digital DC tracking techniques, the accuracy of DC tracking and of the associated estimated variance are functions of the selected buffer size.

Present technology suffers drawbacks in addition to those described above. For example, wireless devices generally must also compensate for clock variances and relative transmitter-receiver clock drift that case data frames to be out of synchronization. Present systems for synchronizing frames are slow, require significant hardware, and are not entirely accurate. Accordingly, present systems can waste valuable time and unnecessarily drop frames.

Although present analog and digital approaches to computing DC offsets and synchronizing frames for wireless communications are functional, they are not sufficiently accurate or otherwise satisfactory. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In summary, the present invention provides a system and method for addressing problems relating to DC compensation, bit synchronization and bit detection, and may be applied within many different types of wireless receivers. In one aspect the present invention provides a system and method for compensating for DC offset and/or clock drift that impacts the operation of a wireless-enabled device. In one exemplary embodiment, the present invention can include a radio module, an analog-to-digital (A/D) converter, a DC tracking loop, and a multi-hypothesis bit synchronizer (MHBS).

The DC tracking loop, for example, can be a digital emulation of a cascade of two analog one-pole LPFs (low pass filters). The DC tracking loop provides flexibility and stability when compared to conventional one-pole LPFs. Additionally, the DC tracking loop can include a variable time constant to provide responsiveness to DC variations caused by frequency drift over time. The output of the DC tracking loop is a DC offset estimate that can account for long term drift and short term fluctuations.

The second component of this embodiment, the MHBS, is configured to compensate for clock drift and provide bit synchronization and clock control. For example, the MHBS can provide bit synchronization by making multiple timing hypotheses with a one sample offset between the adjacent hypotheses, wherein each hypothesis is based upon an accumulation of the DC compensated data over a symbol period. The MHBS then uses the sign of the accumulation for a particular set of samples as the output bit of that particular hypothesis. For example, the output bit is a "1" when the accumulated sum is positive and a "0" when the accumulated sum is negative.

To determine which of the hypotheses is most likely the correct one, the MHBS averages the absolute value of each hypothesis' accumulated sample sum over time, and compares the averaged sample sums. The hypothesis associated with the maximum averaged sample sum is assumed to be best matched to the true symbol timing. As bit detection, the MHBS outputs the bit output from the hypothesis with the maximum average sample sum.

To overcome long timing drift or random timing jitter causing bit slippage, when the maximum averaged sample sum amplitude is not from the optimal, i.e., an on-time hypothesis, the MHBS can apply a timing control logic to recenter the next symbol time. Assuming that the sample rate is N samples per symbol, when a late hypothesis corresponds to the maximum averaged sample sum, the next symbol time is (N+1) samples later rather than N. Similarly, if an early hypothesis corresponds to the maximum averaged sample sum, the next symbol time is (N−1) samples later. Thus, the MHBS recenters the symbol window in both cases, thereby preventing bit slippage.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
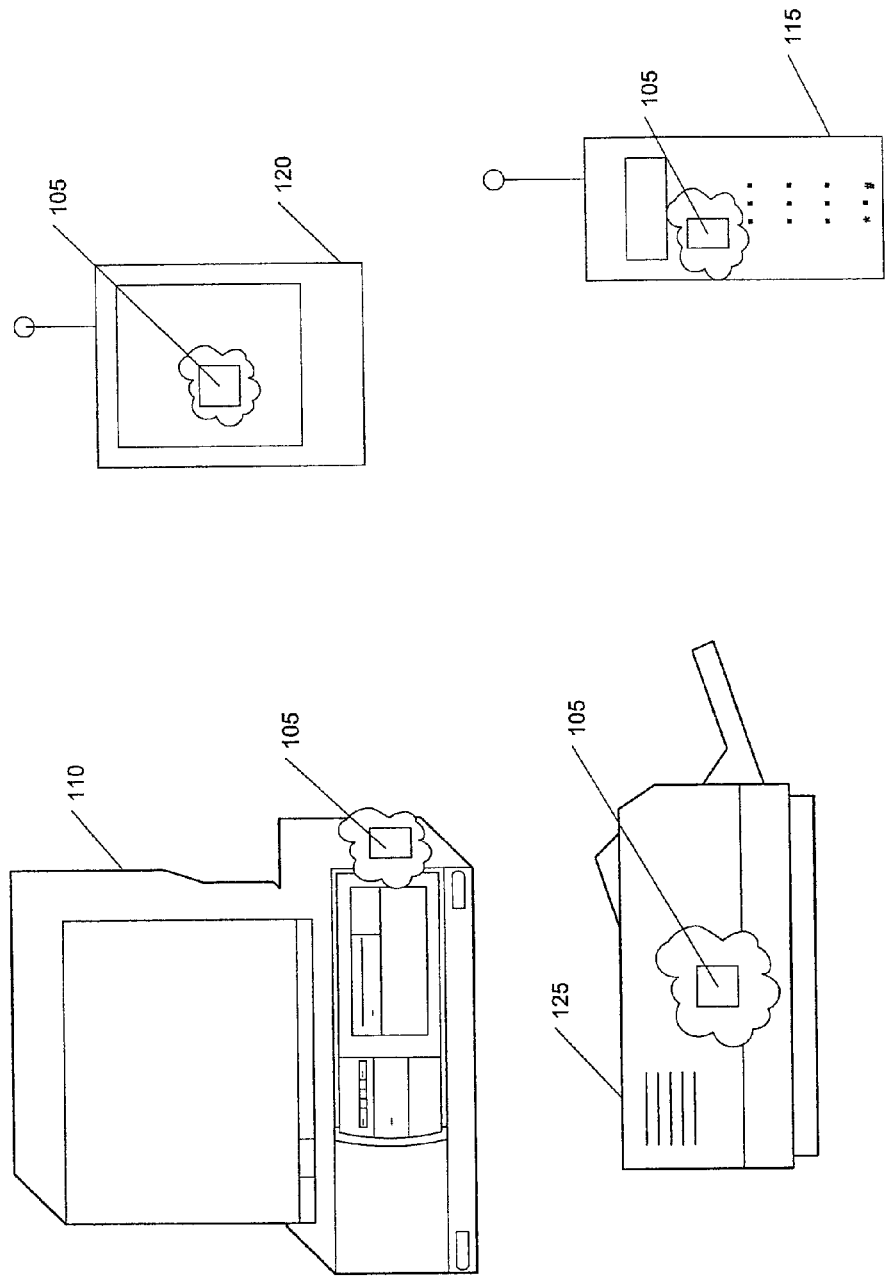
FIG. 1 illustrates various electronic devices with integrated receiver modules in accordance with the principles of the present invention.

Referring now to the drawings, where like or similar elements are designated with identical reference numerals throughout the several views, and referring in particular to FIG. 1, it illustrates examples of electronic devices with integrated receiver modules 105 constructed in accordance with the principles of the present invention. The receiver modules 105 can be implemented in a variety of ways, and preferred implementations of the receiver modules 105 are discussed in detail herein.

Although only a computer 110, a PDA (personal digital assistant) 115, cell phone 120 and peripheral device 125 are illustrated, implementations of the present invention can include any type of wireless-enabled device and should not be limited to those devices shown. Moreover, the receiver modules 105 in these various devices can include, for example, ASICs (application specific integrated circuits), software instructions, general purpose processors, or any combination thereof.

Figure 2:
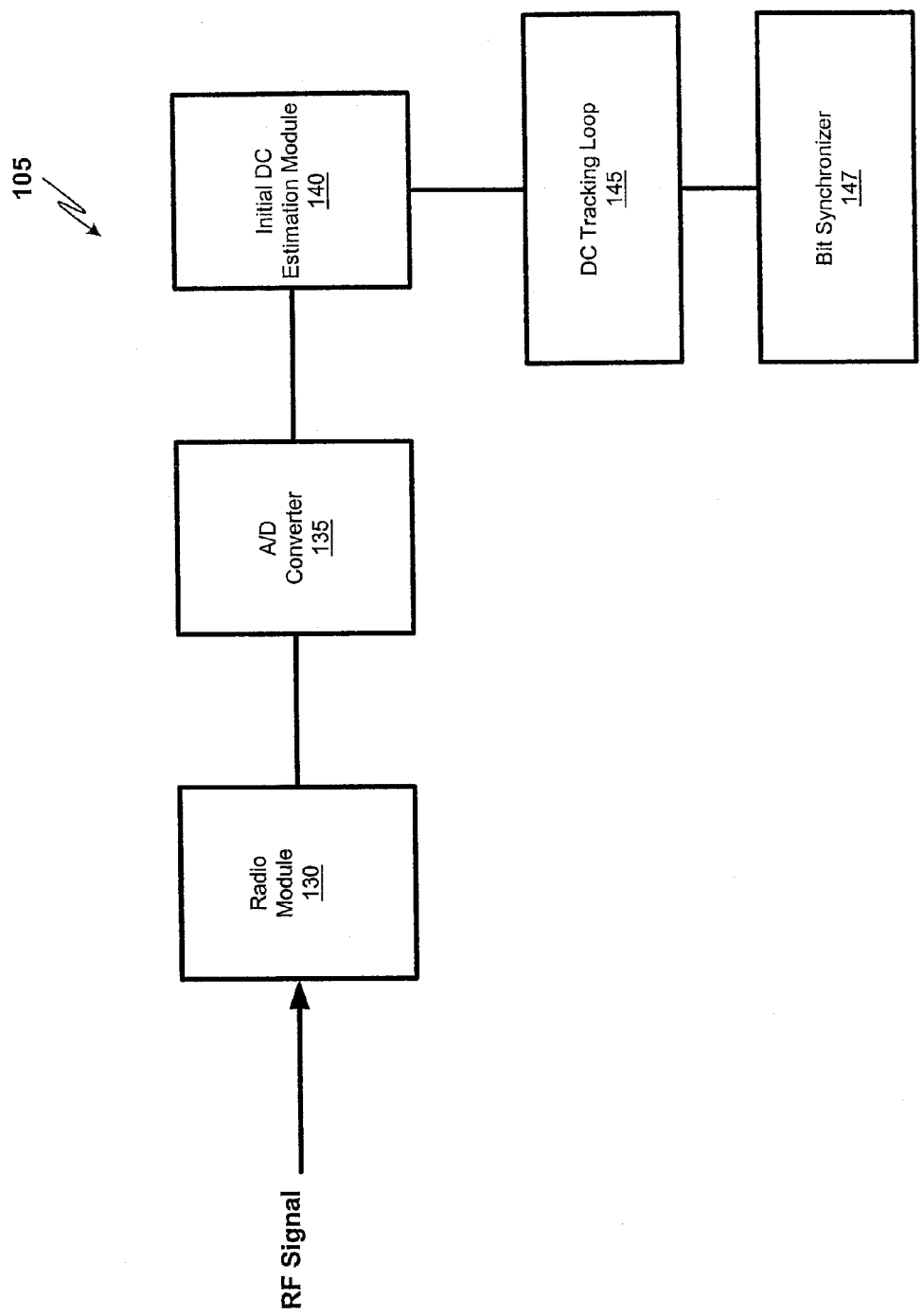
FIG. 2 illustrates in greater detail a receiver module in accordance with the present invention.

FIG. 2 illustrates one implementation of the receiver module 105 of FIG. 1. In this implementation, a RF signal (or any other type of signal) is received at the radio module 130, which demodulates and downconverts the RF signal to a baseband signal. The receiver module 130 then passes the baseband signal to the A/D converter 135, where the analog signal is converted to a digital signal. The A/D converter 135 then passes the digital signal to the initial estimation module 140, which approximates an initial DC offset within the digital signal. This initial DC offset can be passed to a DC tracker 145, which can use the initial DC offset to monitor long-term drift and to generate a corresponding DC offset value which is subtracted from the incoming data signal. The resultant "DC-removed" signal is then provided by the DC tracker 145 to a bit synchronizer 147.

Figure 3:
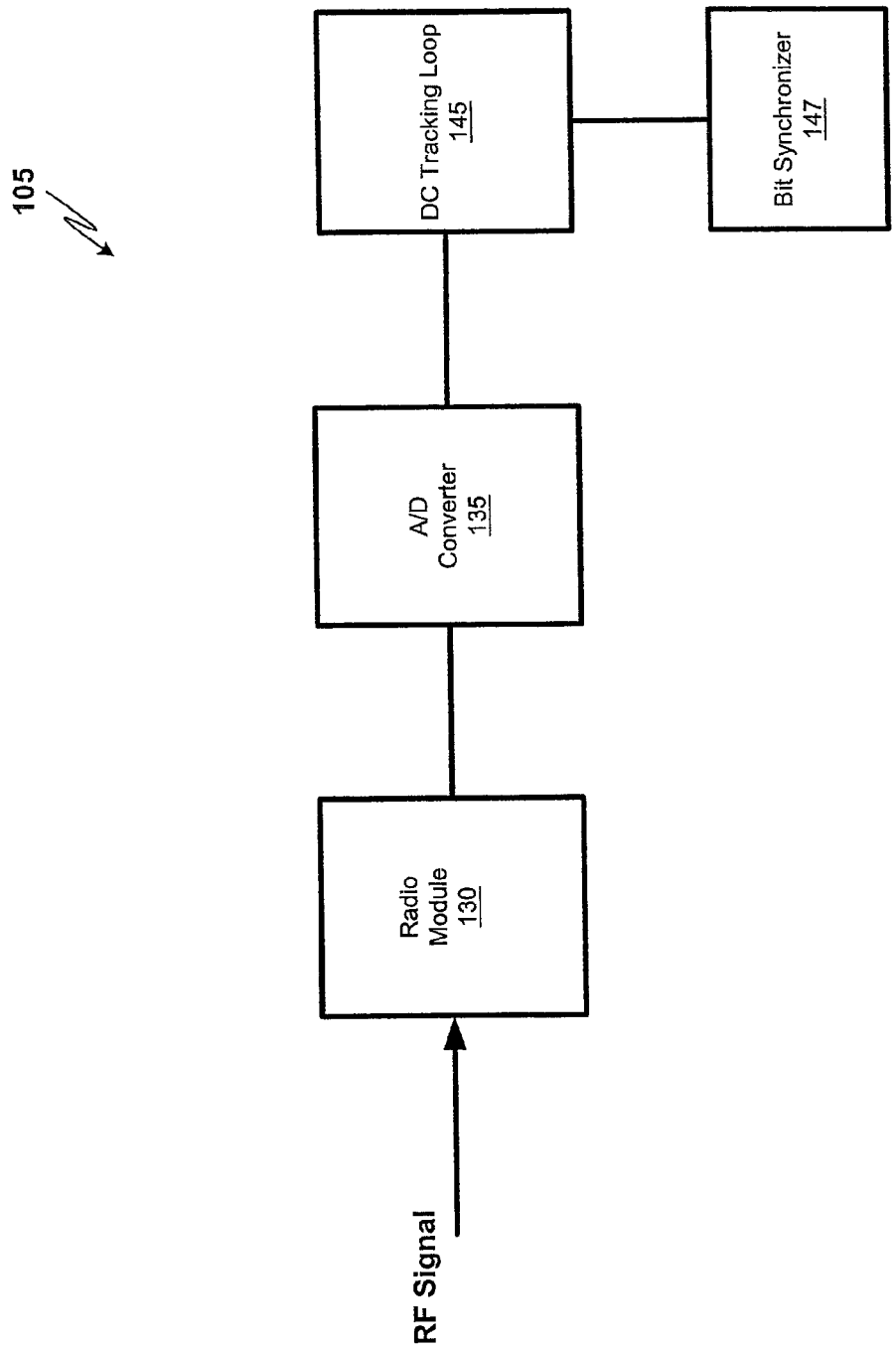
FIG. 3 illustrates an alternate embodiment of the receiver module of FIG. 1.

FIG. 3 shows an alternate embodiment of the present invention. This embodiment is similar to the embodiment shown in FIG. 2 except that the DC tracking loop 145 operates without the benefit of the initial DC offset approximated by the initial estimation module 140. Without the benefit of the initial DC offset estimate, the DC tracking loop 145 may be subject to more overshoot and longer convergence time. However, the DC tracking loop 145 is operable without the initial estimation module 140 and can therefore operate with less power and less circuitry.

Figure 4:
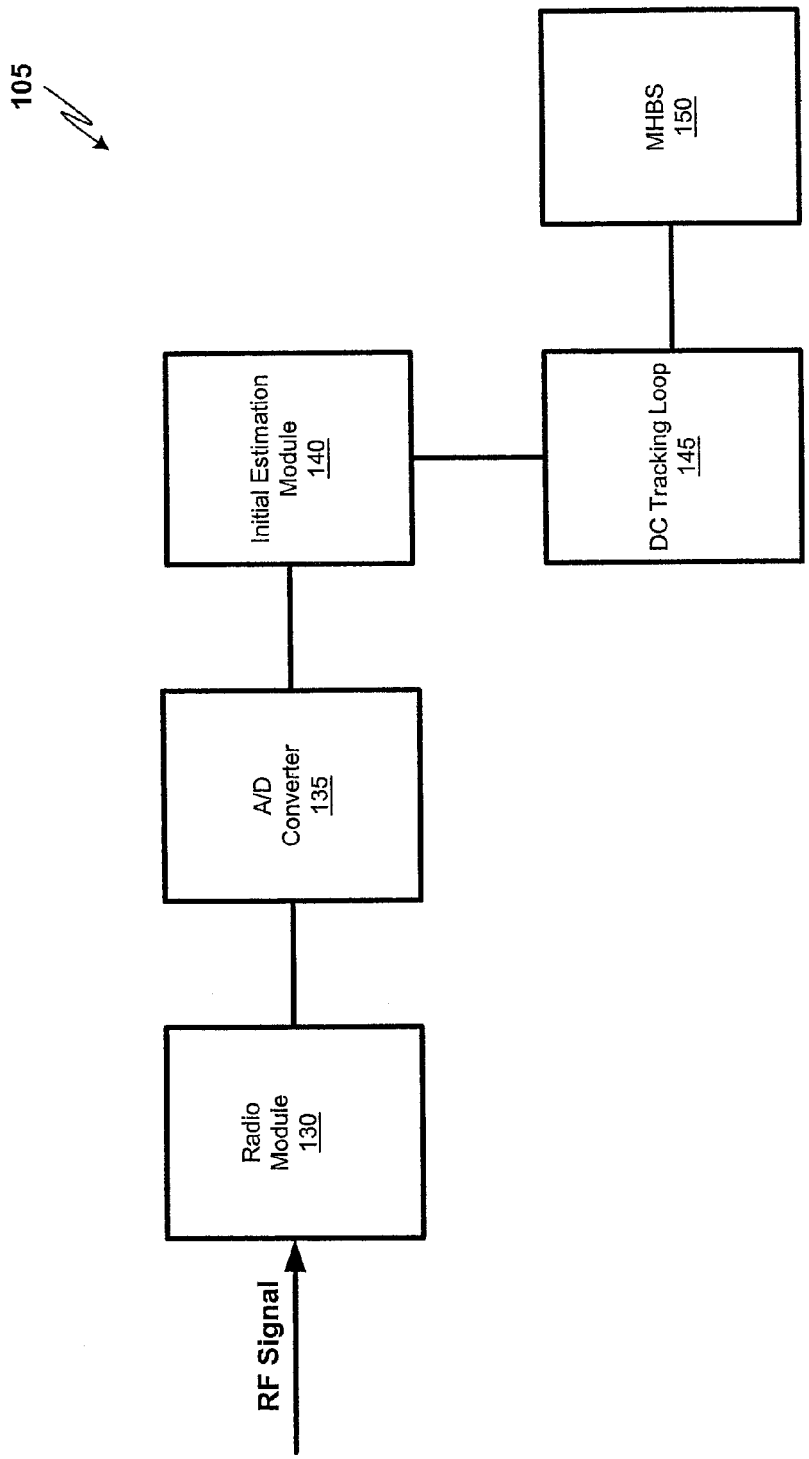
FIG. 4 illustrates an embodiment of the receiver module that also includes an MHBS.

FIG. 4 illustrates an embodiment of the present invention that includes a MHBS 150 in addition to the other components of FIG. 2. The MHBS, in this implementation, is configured to provide bit synchronization. The MHBS 150 can make multiple timing hypotheses using the samples of the incoming signal with a one sample offset between the adjacent hypotheses. In the presently preferred embodiment, three hypotheses are used, an early, an on-time and a late hypothesis. The MHBS 150 performs an accumulation of the DC compensated data received from the DC tracking loop 145 over the nominal symbol period for each of the three hypotheses. Assuming the data sampling rate is N times the symbol rate, there are nominally N samples per symbol. The sign of the sample sum is then used as the output bit of that hypothesis. For example, the output bit is a "1" if the sample sum is positive and a "0" of the sample sum is negative. If k is the current sample time index and y(i)'s are the input samples to the MHBS, the three sample sums can be represented by $$SS_E(k) = \sum_{i=k-(N+1)}^{k-2} y(i)$$

$$SS_O(k) = \sum_{i=k-N}^{k-1} y(i)$$

$$SS_L(k) = \sum_{i=k-(N-1)}^{k} y(i).$$

To determine which hypotheses' output bit is likely the correct one, the absolute value of each hypothesis' sample sum is averaged over time—called the averaged sample sum. This computation is represented by $$E(k)=|SS_E(k)|$$

$$O(k)=|SS_O(k)|$$

$$L(k)=|SS_L(k)|$$

$$\overline{E}(k)=b \cdot E(k)+(1-b)\overline{E}(k-1)$$

$$\overline{O}(k)=b \cdot O(k)+(1-b)\overline{O}(k-1)$$

$$\overline{L}(k)=b \cdot L(k)+(1-b)\overline{L}(k-1)$$

In an exemplary implementation, hardware complexity is reduced by implementing the multiplication operations in the above expressions as bit shift operations. For example, if one lets $b=\frac{1}{2}^\beta$, then multiplication of a quantity y by the parameter b may instead be effected through a bit shift operation ">>" as follows:

$$b \cdot y=(y>>\beta)$$

where the parameter $\beta$ is used to control the integration time.

A three-way comparison is then made between the averaged sample sums, and the hypothesis that corresponds to the maximum averaged sample sum is assumed to be the one best matched to the true symbol timing. The final output bit value is the bit output from the hypothesis with the maximum average sample sum amplitude.

The above set of operations are normally repeated every N samples, which is the nominal symbol rate. However, to overcome long timing drift or random timing jitter that can cause bit slippage, when the maximum average sample sum amplitude is not from the on-time hypothesis, a timing control logic can be applied to change the next symbol time. For example, when the late hypothesis corresponds to the maximum averaged sample sum, the next symbol time is (N+1) samples later rather than N. Similarly, when the early hypothesis corresponds to the maximum averaged sample sum, the next symbol time is (N−1) samples later. By adjusting the symbol time, the symbol window is recentered, and bit slippage is prevented.

Adjusting the symbol timing can impact the computation of the next averaged sample sum. However, to keep the correct averaging operation, the MHBS 150 can perform a memory swap between the feedback values of the three integrators as dictated by the direction of the rotation toward the center, e.g., the on-time sample hypothesis. For example, if the early hypothesis is the maximum, the memory swap is represented by $$tmp=\overline{L}(k-1)$$

$$\overline{O}(k-1)=\overline{E}(k-1)$$

$$\overline{L}(k-1)=\overline{O}(k-1)$$

$$\overline{E}(k-1)=tmp.$$

As can be appreciated by those skilled in the art, the direction of the memory swap is reversed if the late hypothesis instead of the early hypothesis is determined to correspond to the maximum averaged sample sum.

Figure 5:
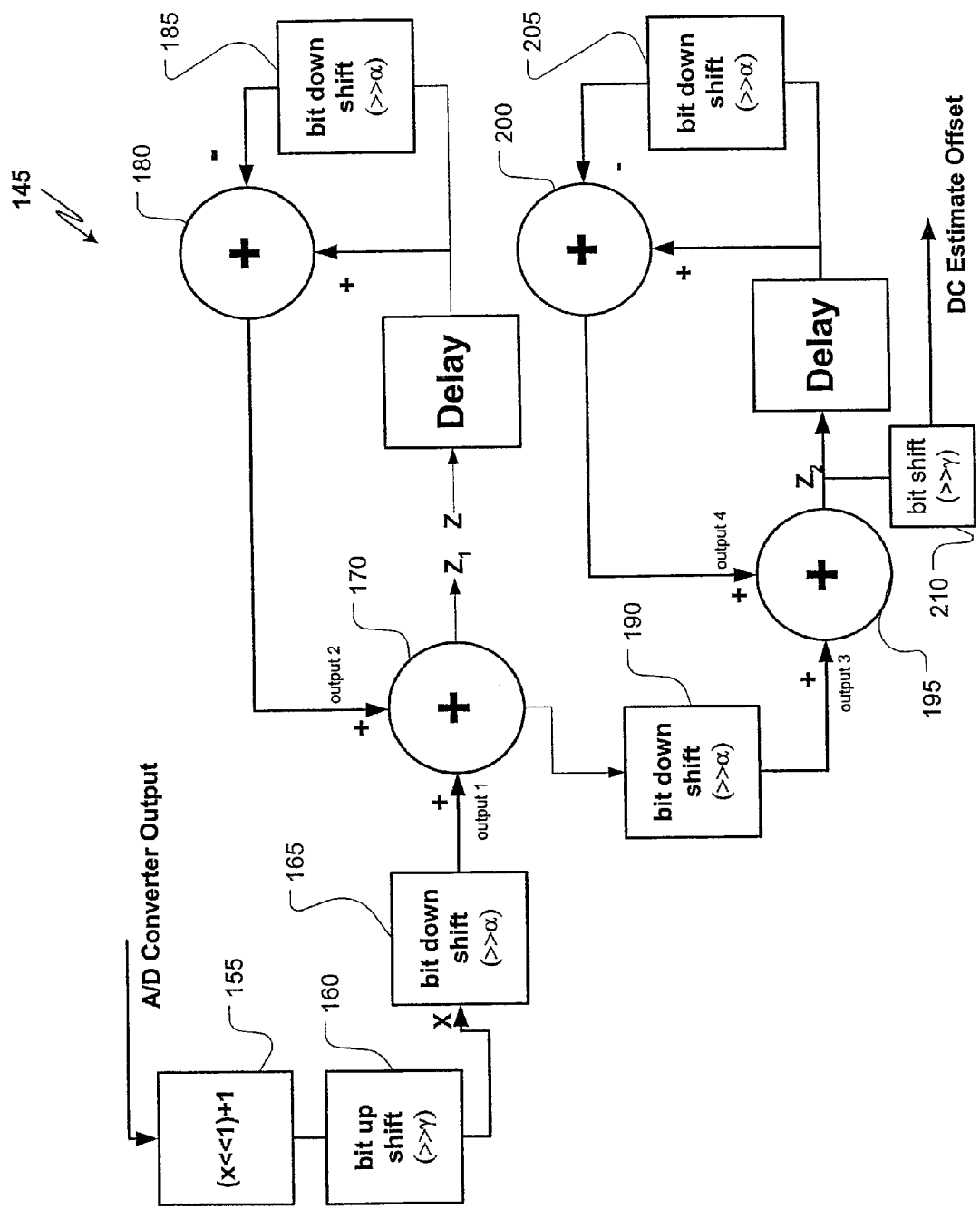
FIG. 5 illustrates an implementation of the DC tracker of FIGS. 2-4.

Referring now to FIG. 5, it illustrates in more detail an implementation of the DC tracking loop 145 shown in FIGS. 2 through 4. In this embodiment, the DC tracking loop 145 is a cascade of two one-pole LPF emulator and can be expressed by $$z_1(k) = ax(k) + (1-a)z(k-1)$$

$$z_2(k) = az_1(k) + (1-a)z_2(k-1)$$

$$z(k) = \begin{cases} z_1(k), & \text{for faster loop response} \\ (z_1(k) + z_2(k))/2, & \text{for slower loop response} \end{cases}$$

where x(k) comprises a balanced input sample (i.e., between the quantities +X and −X), and where a is the loop time constant. Again, letting $a=\frac{1}{2}^\alpha$, then a bit shift operation ">>" may be substituted for multiplication as follows:

$$a \cdot y=(y>>\alpha)$$

Figure 6:
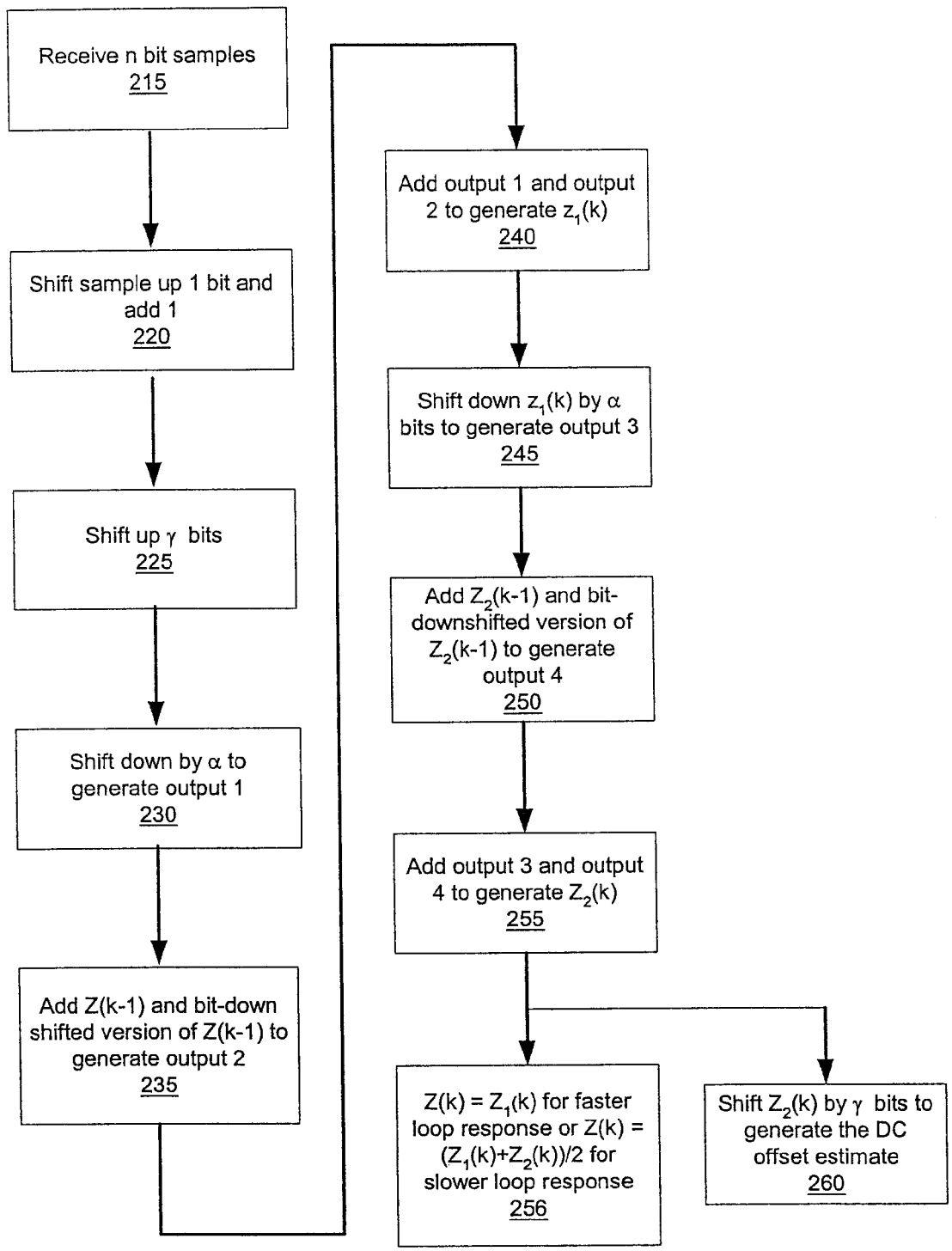
FIG. 6 is a flowchart of one method of operating the DC tracker of FIG. 5.

The operation of the DC tracking loop 145 is illustrated by reference to the flowchart in FIG. 6. Initially, shifter 155 receives an n bit sample from the A/D converter 135—preferably in the two's complement format (step 215). Shifter 155 shifts the input up by one bit and adds one (step 220). This process correctly balances the input by making the input dynamic range between $-(-2^n-1)$ and $(+2^n-1)$. Shifter 160 then shifts the output received from shifter 155 up by γ bits to increase the operational precision inside the DC tracking loop 145 (step 225). Shifter 165 next downshifts the output from shifter 160 by α bitsstep 230). Moreover, the parameter α can be used to change the time constant of the DC tracking loop 145 and can be adjusted so that the DC tracking loop 145 is responsive and flexible enough to follow DC variations caused by frequency drift over time.

Next, the output from shifter 165 is provided to adder 170. The other input to adder 170 comes from a scaled feedback value, wherein the feedback value is z(k−1), where z(k) is represented by $$z(k) = \begin{cases} z_1(k), & \text{for faster loop response} \\ (z_1(k) + z_2(k))/2, & \text{for slower loop response} \end{cases}$$

In other words, the other input to adder 170 is the output from adder 180, which takes the difference between z(k−1) and the value of z(k−1) after being downshifted by "α" bits within shifter 185 (step 240 and 245).

The output from adder 170 is $z_1$, which can be expressed as $$z_1(k)=(x(k)>>\alpha)+z(k-1)-(z(k-1)>>\alpha).$$

The output from adder 170, $z_1$, is provided to shifter 190 where it is downshifted by α bits and provided a first of the inputs to adder 195 (step 245). The output from adder 195 is $z_2(k)$, which can be expressed as $$z_2(k)=(z_1(k)>>\alpha)+z_2(k-1)-(z_2(k-1)>>\alpha).$$

$(z_2(k-1)>>\alpha)$

As shown in FIG. 5, a second of the inputs applied to adder 195 comprises a delayed version of a previous output of the adder 195 (i.e., $z_2(k-1)$) in combination (via adder 200) with this same delayed version after downshifting by α bits (i.e., $(z_2(k-1)>>\alpha)$) (steps 250 and 255). Finally, shifter 210 downshifts $z_2(k)$ by γ bits so that the output of DC tracking loop 145 is a (n+1)-bit representation of the DC offset estimate (step 260).

Figure 7:
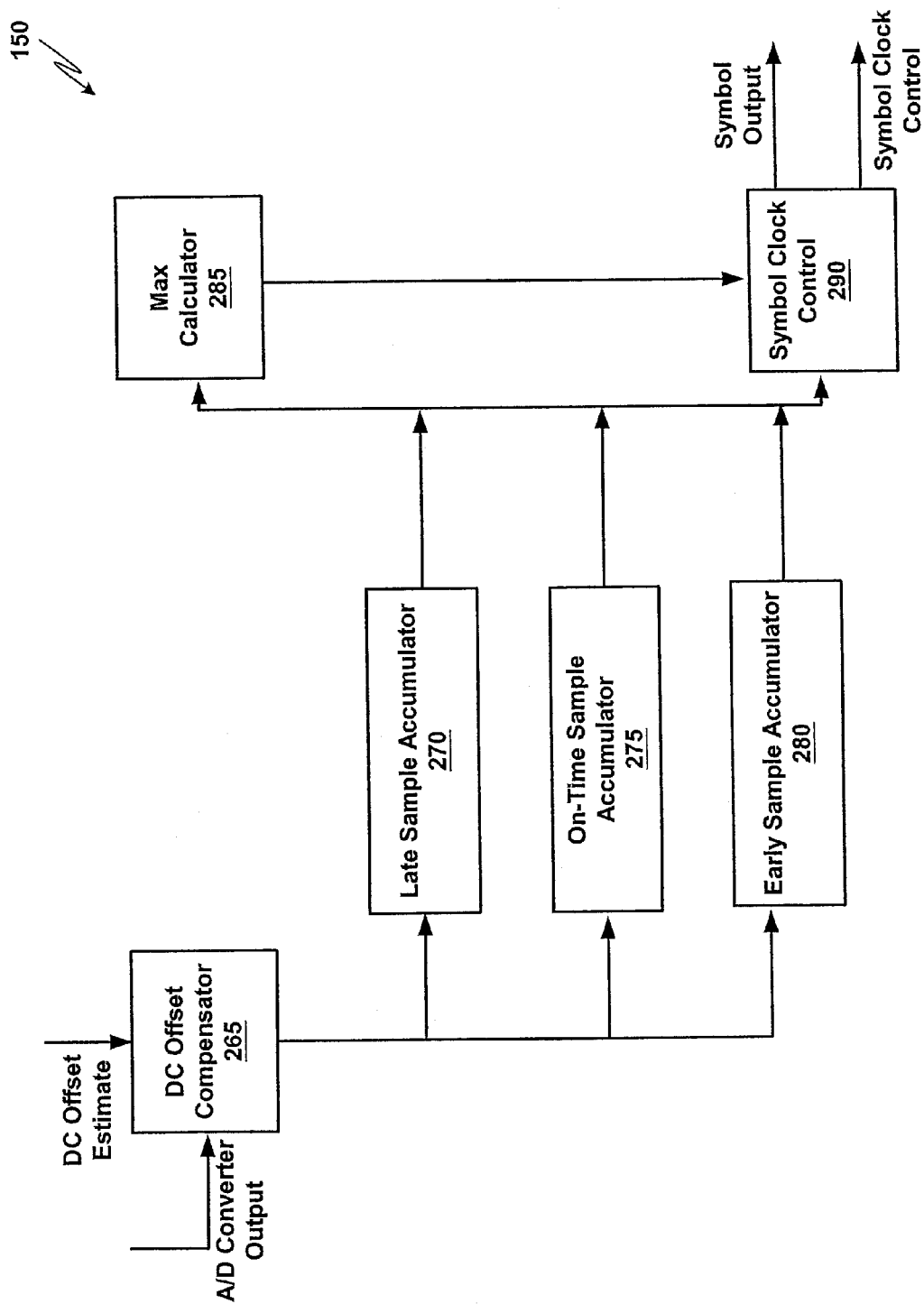
FIG. 7 illustrates a block diagram of one implementation of the MHBS of FIG. 4.

Referring now to FIG. 7, it illustrates one implementation of the MHBS 150. In this implementation, the DC offset compensator 265 computes the difference between the output of the A/D converter and a DC offset estimate as generally determined by the DC tracking loop 145. During the initial startup, however, the DC offset estimate can come from the initial estimation module 140. In both cases, the output from the DC offset compensator 265 is provided to the late sample accumulator 270, the on-time sample accumulator 275 and the early sample accumulator 280. Each of the accumulators performs an accumulation of the DC compensated data over N samples with a one sample offset between each of the accumulations. Additionally, each of the accumulators generates the sign of that accumulation as an output, which is representative of the sample symbol. As previously described, the detector output bit is "1" if the accumulation is positive and "0" if the accumulation is negative.

If k is the current sample time index and y(i)'s are the input samples to the MBS 150, the three sample sums corresponding to the early, on-time and late sample hypotheses are respectfully represented as:

$$SS_E(k) = \sum_{i=k-(N+1)}^{k-2} y(i);$$

$$SS_O(k) = \sum_{i=k-N}^{k-1} y(i); \text{ and}$$

$$SS_L(k) = \sum_{i=k-(N-1)}^{k} y(i).$$

To determine which hypothesis' output bit is most likely correct, as an approximation to the maximum likelihood estimation, the absolute value of each hypothesis' accumulation (also called a sample sum) is averaged over time. This is represented by $$E(k)=|SS_E(k)|$$

$$O(k)=|SS_O(k)|$$

$$L(k)=|SS_L(k)|$$

$$\overline{E}(k)=(E(k)>>\beta)+\overline{E}(k-1)-(\overline{E}(k-1)>>\beta)$$

$$\overline{O}(k)=(O(k)>>\beta)+\overline{O}(k-1)-(\overline{O}(k-1)>>\beta)$$

$$\overline{L}(k)=(L(k)>>\beta)+\overline{L}(k-1)-(\overline{L}(k-1)>>\beta)$$

where the parameter $\beta$ is used to control the integration time.

As previously described, the max calculator 285 performs a comparison between the averaged sample sums. The hypothesis associated with the maximum averaged sample sum is assumed to be the one best matched to the true symbol timing, and the final output bit value—the "symbol" output of FIG. 7—is the bit output from the hypothesis with the maximum average sample sum.

To overcome long timing drift or random timing jitter causing bit slippage, when the maximum averaged sample sum amplitude is not from the optimal, e.g., an on-time sample hypothesis, the symbol clock control 290 recenters the next symbol time. Assuming that the sample rate is N samples per symbol, when the late sample hypothesis corresponds to the maximum averaged sample sum, the next symbol time is (N+1) samples later rather than N. Similarly, if an early hypothesis corresponds to the maximum averaged sample sum, the next symbol time is (N−1) samples later.

Figure 8:
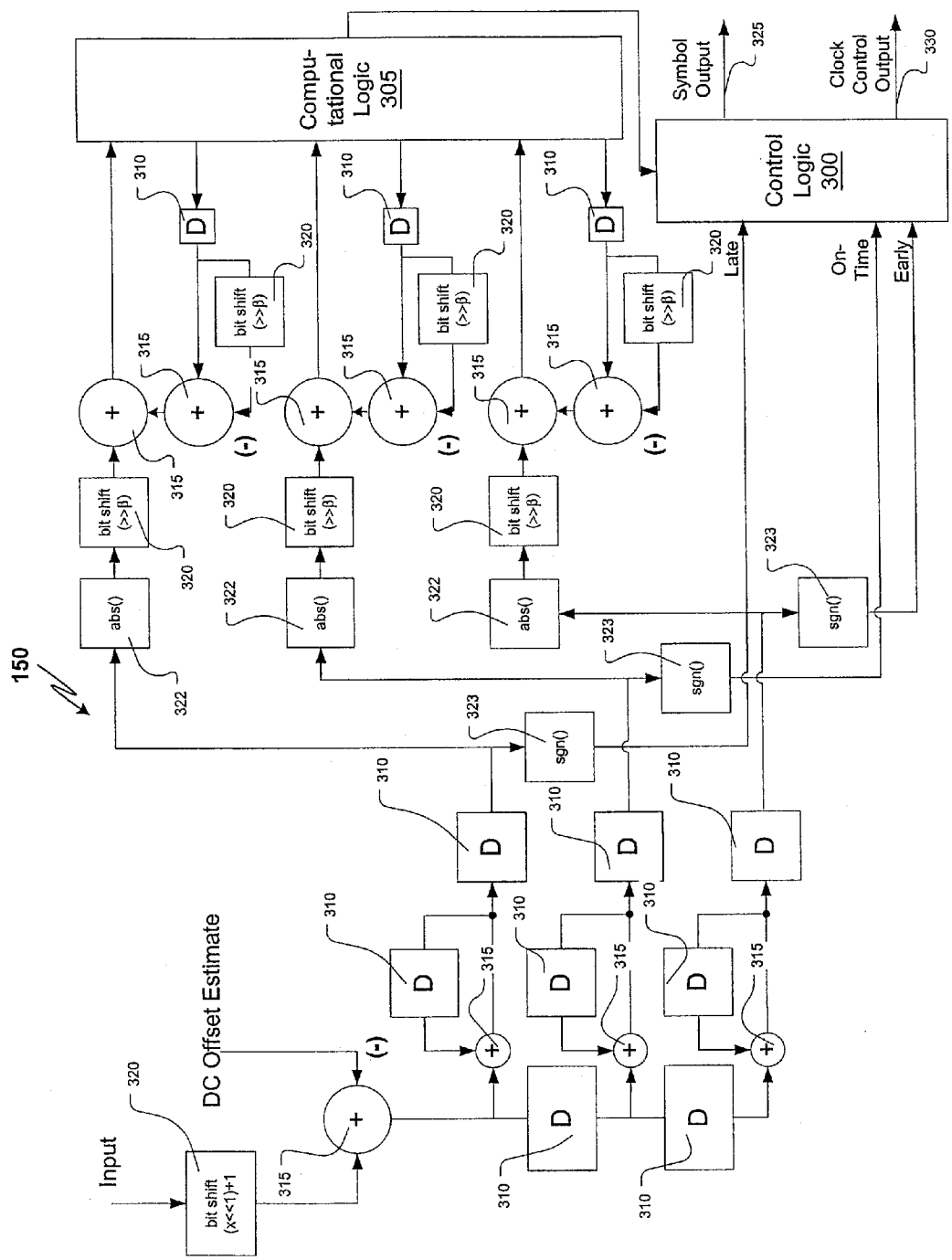
FIG. 8 illustrates the MHBS of FIG. 7 in greater detail.

FIG. 8 shows a more detailed diagram of the MHBS 150. This embodiment uses a plurality of delay devices 310, adders 315, shifters 320, absolute value modules 322, and sign modules 323 to determine the symbol output 325 and to generate a clock control output 330 that controls the symbol timing. Additionally, this embodiment uses two logic units: a control logic unit 300 and a computational logic unit 305. The control logic unit 300 is configured to select the correct symbol output and to correct the symbol clock, and the computational logic unit 305 is configured to identify the maximum of the average sample sum amplitudes and to perform the necessary memory swaps—whether in a separate memory unit or in a memory integrated with the computational logic 305. In operation, the embodiment shown in FIG. 8 operates generally the same as the embodiment shown in FIG. 7.

In conclusion, the present invention provides, among other things, a system and method for compensating for DC offset and for clock drift and jitter. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A handheld wireless communications device, comprising:
   a DC offset compensator, a plurality of sample accumulators and a maximum identifier, each of the plurality of sample accumulators being operatively coupled to the DC offset compensator, the maximum identifier being operatively coupled with each of the plurality of sample accumulators, the maximum identifier being configured to identify a maximum output of the plurality of sample accumulators, the maximum identifier being configured to cause an output to be generated according to the identified maximum output.

2. The wireless communications device according to claim 1, wherein the plurality of sample accumulators comprises an on-time accumulator.

3. The wireless communications device according to claim 2, comprising:
   a clock control operatively coupled to the maximum identifier.

4. The wireless communications device according to claim 1, comprising:
   a clock control operatively coupled to the maximum identifier.

5. The wireless communications device according to claim 4, wherein the clock control is configured to adjust a timing responsive to the maximum identifier identifying the maximum output to be from one of the plurality of sample accumulators other than the on-time accumulator.

6. The wireless communications device according to claim 1, comprising:
   a DC tracking loop operatively coupled to the DC offset compensator, the DC tracking loop being configured to provide a DC estimate to the DC offset compensator.

7. The wireless communications device according to claim 1, wherein the wireless communications device comprises a cellular phone.

8. The wireless communications device according to claim 1, wherein the wireless communications device comprises a personal digital assistant (PDA).

9. The wireless communications device according to claim 1, wherein the wireless communications device comprises a peripheral device.

10. The wireless communications device according to claim 1, wherein the wireless communications device comprises a computer.

11. The wireless communications device according to claim 1, wherein the plurality of accumulators comprises an early accumulator, an on-time accumulator and a late accumulator.

12. A cellular phone, comprising:
a receiver that comprises a DC offset compensator, a plurality of sample accumulators and a maximum identifier, each of the plurality of sample accumulators being operatively coupled to the DC offset compensator, the maximum identifier being operatively coupled with each of the plurality of sample accumulators, the maximum identifier being configured to identify a maximum output of the plurality of sample accumulators, the maximum identifier being configured to cause an output to be generated according to the identified maximum output.

13. The cellular phone according to claim 12, wherein the plurality of sample accumulators comprises an on-time accumulator.

14. The cellular phone according to claim 13, comprising:
a clock control operatively coupled to the maximum identifier, the clock control being configured to adjust a timing responsive to the maximum identifier identifying the maximum output to be from one of the plurality of sample accumulators other than the on-time accumulator.

15. The cellular phone according to claim 12, comprising:
a DC tracking loop operatively coupled to the DC offset compensator, the DC tracking loop being configured to provide a DC estimate to the DC offset compensator.

16. The cellular phone according to claim 12, wherein the cellular phone comprises a personal digital assistant (PDA).

17. The cellular phone according to claim 12, wherein the receiver comprises an application specific integrated circuit (ASIC).

18. The cellular phone according to claim 12, wherein the receiver comprises an integrated circuit.

19. The cellular phone according to claim 12, wherein the receiver comprises radio circuitry, an analog-to-digital converter and a DC tracking loop.

20. The cellular phone according to claim 12, wherein the plurality of accumulators comprises an early accumulator, an on-time accumulator and a late accumulator.

* * * * *